United States Patent
Hsu et al.

(10) Patent No.: US 8,803,157 B2
(45) Date of Patent: Aug. 12, 2014

(54) DISPLAY DEVICE AND MANUFACTURING METHOD THEREOF

(71) Applicant: E Ink Holdings Inc., Hsinchu (TW)

(72) Inventors: Cheng-Hang Hsu, Hsinchu (TW); Ted-Hong Shinn, Hsinchu (TW); Chuang-Chuang Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/726,208

(22) Filed: Dec. 23, 2012

(65) Prior Publication Data

US 2013/0256677 A1 Oct. 3, 2013

(30) Foreign Application Priority Data

Mar. 28, 2012 (TW) .............................. 101110797 A (51) Int. Cl.
*H01L 27/15* (2006.01)

(52) U.S. Cl.
USPC .............................................. 257/72; 438/24

(58) Field of Classification Search
USPC ................. 257/72, 59, E27.152, E27.131
See application file for complete search history.

(56) References Cited

U.S. PATENT DOCUMENTS

| 7,317,210 | B2 | 1/2008 | Brabec et al. | |
| 7,586,034 | B2 | 9/2009 | Han et al. | |
| 7,696,514 | B2 * | 4/2010 | Kokubo et al. | 257/59 |
| 8,018,426 | B2 | 9/2011 | Ishibashi et al. | |
| 2004/0217357 | A1 * | 11/2004 | Zhang et al. | 257/72 |
| 2009/0071533 | A1 | 3/2009 | Choi et al. | |
| 2010/0114679 | A1 | 5/2010 | Pan | |
| 2011/0171447 | A1 | 7/2011 | Krishnamoorthy et al. | |
| 2011/0286076 | A1 * | 11/2011 | Lin et al. | 359/296 |

FOREIGN PATENT DOCUMENTS

| TW | 201020799 | 6/2010 |
| TW | 201104328 | 2/2011 |
| TW | M410951 | 9/2011 |

* cited by examiner

*Primary Examiner* — Thao P Le (74) *Attorney, Agent, or Firm* — Jianq Chyun IP Office (57) ABSTRACT

A display device is provided, which includes a transparent substrate, an active device array, a solar cell structure and an electrophoretic display film. The transparent substrate has an upper surface and a lower surface opposite to each other. The active device array has a plurality of pixel structures, in which the pixel structures are disposed on the upper surface of the transparent substrate. The solar cell structure is directly disposed on the lower surface of the transparent substrate. The electrophoretic display film is disposed over the transparent substrate and includes a transparent protection film, an electrode layer and a plurality of display media, in which the electrode layer is disposed between the transparent protection film and the display media and the display media are located between the electrode layer and the active device array.

10 Claims, 7 Drawing Sheets

DISPLAY DEVICE AND MANUFACTURING METHOD THEREOF

CROSS-REFERENCE TO RELATED APPLICATION

This application claims the priority benefit of Taiwan application serial no. 101110797, filed on Mar. 28, 2012. The entirety of the above-mentioned patent application is hereby incorporated by reference herein and made a part of this specification.

BACKGROUND OF THE INVENTION

1. Field of the Invention

The invention generally relates to a display device and a manufacturing method thereof, and more particularly, to an electrophoretic display device and a manufacturing method thereof.

2. Description of Related Art

Along with the popularity of information products and technology development, the displays have been pursuing a major object of light, thin, and flexible feature. The electrophoretic display device is just high-profile one of the devices to pursue the object.

The common electrophoretic display device currently is formed by an electrophoretic display film and an active array substrate. The electrophoretic display film has an electrophoretic display material therein and the material contains a display solution and a plurality of display particles dispersed in the display solution. When the display particles are driven by the active array substrate, the display particles migrate upwards (direction close to the reader) or downwards (direction apart from the reader). When the light of an outside light source is reflected by the display particles, the reader can observe the display particles or the color of the display solution to get the image of the corresponding frame.

The electrophoretic display device can directly use the external light source to display, and thus saves the light source to reduce energy consumption. However, the electrophoretic display device still need an external power as a source of the driving voltage, which causes the use inconvenience.

SUMMARY OF THE INVENTION

Accordingly, the invention is directed to a display device able to reduce the need of an external power and having feature of storing electricity and saving energy.

The invention is also directed to a manufacturing method of display device for fabricating the above-mentioned display device.

An embodiment of the invention provides a display device, which includes a transparent substrate, an active device array, a solar cell structure and an electrophoretic display film. The transparent substrate has an upper surface and a lower surface opposite to each other. The active device array has a plurality of pixel structures, in which the pixel structures are disposed on the upper surface of the transparent substrate. The solar cell structure is directly disposed on the lower surface of the transparent substrate. The electrophoretic display film is disposed over the transparent substrate and includes a transparent protection film, an electrode layer and a plurality of display media, in which the electrode layer is disposed between the transparent protection film and the display media and the display media are located between the electrode layer and the active device array.

In an embodiment of the present invention, the above-mentioned solar cell structure includes a plurality of cell units, each of the cell units includes a first conductive layer, a second conductive layer and a photovoltaic layer. The first conductive layer is disposed on the lower surface of the transparent substrate, and the photovoltaic layer is located between the first conductive layer and the second conductive layer.

In an embodiment of the present invention, the above-mentioned cell units are electrically connected to each other in series.

In an embodiment of the present invention, the above-mentioned first conductive layer includes a first transparent conductive layer, the photovoltaic layer contains a P-type doped microcrystalline silicon, an intrinsic microcrystalline silicon absorber layer and an N-type doped microcrystalline silicon sequentially disposed on the first conductive layer. The second conductive layer includes a second transparent conductive layer and a metallic electrode layer.

In an embodiment of the present invention, the above-mentioned solar cell structure includes a microcrystalline silicon film solar cell, an organic solar cell, a polysilicon film solar cell or a CIGS (copper-indium-gallium-selenide) solar cell.

An embodiment of the invention provides a manufacturing method of a display device, the method includes: providing a transparent substrate, wherein the transparent substrate has an upper surface and a lower surface opposite to each other; forming an active device array on the upper surface of the transparent substrate; directly forming a solar cell structure on the lower surface of the transparent substrate; and adhering an electrophoretic display film on the active device array. The electrophoretic display film includes a transparent protection film, an electrode layer and a plurality of display media. The electrode layer is disposed between the transparent protection film and the display media, and the display media are located between the electrode layer and the active device array.

In an embodiment of the present invention, the above-mentioned solar cell structure is formed prior to forming the active device array and the solar cell structure includes a microcrystalline silicon film solar cell or a CIGS (copper-indium-gallium-selenide) solar cell.

In an embodiment of the present invention, the above-mentioned manufacturing method of display device further includes: after forming the solar cell structure but prior to forming the active device array, forming a protection layer to cover the solar cell structure; and after forming the active device array, removing the protection layer to expose out the solar cell structure.

In an embodiment of the present invention, the above-mentioned solar cell structure is formed after forming the active device array and the solar cell structure includes a microcrystalline silicon film solar cell or an organic solar cell.

In an embodiment of the present invention, the above-mentioned manufacturing method of display device further includes: after forming the active device array but prior to forming the solar cell structure, forming a protection layer to cover the active device array; and after forming the solar cell structure, removing the protection layer to expose out the active device array.

Based on the description above, since the display device of the invention has a solar cell structure, so that in the running state of the display device, the solar cell structure can directly convert ambient light into the electric energy required by the electrophoretic display film and store the electric energy for reusing later. In this way, the display device of the invention can reduce the demand on the external electric energy and features storing the electric energy and saving energy.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1A:
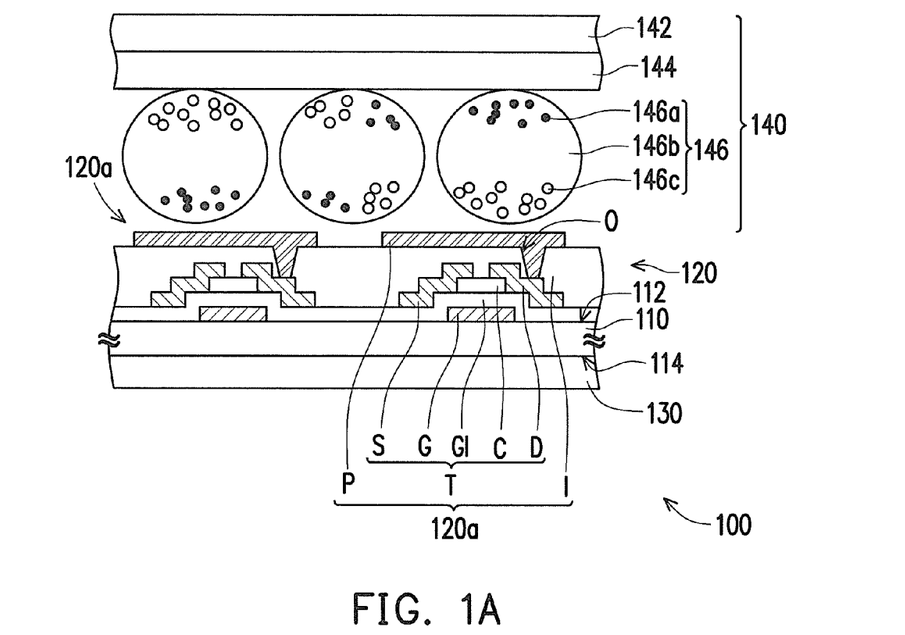
FIG. 1A is a cross-sectional diagram of a display device according to an embodiment of the invention.
Figure 1B:
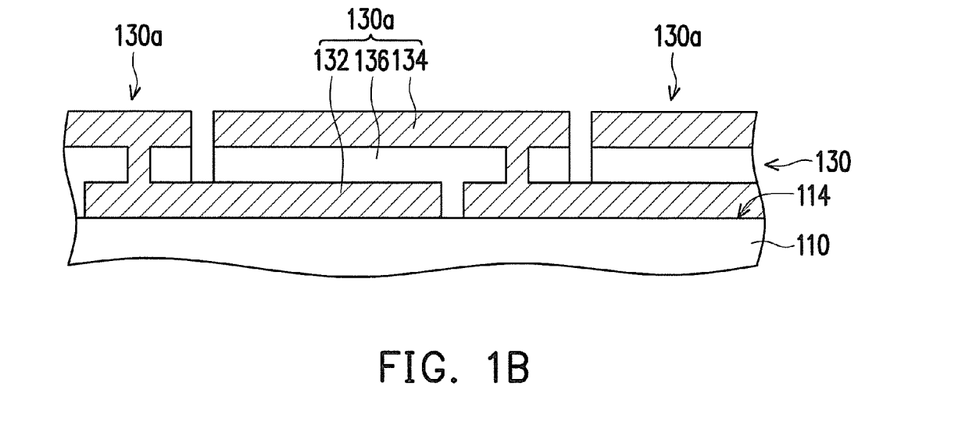
FIG. 1B is a cross-sectional diagram of the solar cell structure of FIG. 1A.

FIG. 1A is a cross-sectional diagram of a display device according to an embodiment of the invention and FIG. 1B is a cross-sectional diagram of the solar cell structure of FIG. 1A. Referring to FIGS. 1A and 1B, in the embodiment, a display device 100 includes a transparent substrate 110, an active device array 120, a solar cell structure 130 and an electrophoretic display film 140. In more details, the transparent substrate 110 has an upper surface 112 and a lower surface 114 opposite to each other, in which the material of the transparent substrate 110 is, for example, glass or plastic.

The active device array 120 has a plurality of pixel structures 120a disposed on the upper surface 112 of the transparent substrate 110. Each of the pixel structures 120a comprises a gate G, a gate insulating layer GI, a semiconductor channel layer C, a source S, a drain D, an insulating layer I and a pixel electrode P, wherein the gate G, the gate insulating layer GI, the semiconductor channel layer C, the source S and the drain D comprise a thin film transistor (TFT). The gate G is disposed on the upper surface 112 of the transparent substrate 110, and the gate insulating layer GI, the semiconductor channel layer C, the source S/drain D, the insulating layer I and the pixel electrode P are sequentially stacked on the gate G. The insulating layer I has an opening O exposing a portion of the drain D and the pixel electrode P is electrically connected to the drain D through the opening O. In short, the TFT T is a top gate TFT. In other unshown embodiments however, the TFT T can be a bottom gate TFT or a coplanar TFT, which the invention is not limited to. In addition, the material of the pixel electrode P is, for example, transparent conductive material.

The solar cell structure 130 is directly disposed on the lower surface 114 of the transparent substrate 110. Referring to FIG. 1B, in the embodiment, the solar cell structure 130 includes a plurality of cell units 130a, and each of the cell units 130a includes a first conductive layer 132, a second conductive layer 134 and a photovoltaic layer 136. The cell units 130a are, for example, electrically connected to each other in series for boosting voltage. The first conductive layer 132 is directly disposed on the lower surface 114 of the transparent substrate 110 and the photovoltaic layer 136 is located between the first conductive layer 132 and the second conductive layer 134. In the art the present invention belongs to, the solar cell structure 130 can further include other films and the above-mentioned configuration is an example only, which the invention is not limited to. For example, the first conductive layer 132 can include a transparent conductive layer; the photovoltaic layer 136 contains a P-type doped microcrystalline silicon, an intrinsic microcrystalline silicon absorber layer and an N-type doped microcrystalline silicon sequentially disposed on the first conductive layer 132; the second conductive layer 134 includes a transparent conductive layer and a metallic electrode layer. The solar cell structure 130 herein is, for example, a microcrystalline silicon film solar cell, an organic solar cell, a polysilicon film solar cell or a CIGS (copper-indium-gallium-selenide) solar cell.

The electrophoretic display film 140 is disposed over the transparent substrate 110 and includes a transparent protection film 142, an electrode layer 144 and a plurality of display media 146. The electrode layer 144 is disposed between the transparent protection film 142 and the display media 146 and the display media 146 are located between the electrode layer 144 and the active device array 120. In the embodiment, each of the display media 146 includes an electrophoretic liquid 146b and a plurality of black charged particles 146a and white charged particles 146c both distributed in the electrophoretic liquid 146b, in which the black charged particles 146a and the white charged particles 146c are driven by a DC voltage or an AC voltage. In this way, each of the pixel structures 120a respectively displays black color, white color or gray color with different graylevel. In other unshown embodiments, each of the display media 146 includes an electrophoretic liquid 146b and a plurality of white charged particles and the electrophoretic liquid herein is, for example, black electrophoretic liquid; or the electrophoretic liquid and the charged particles can have other colors, which the invention is not limited to.

Since the display device 100 of the embodiment has a solar cell structure 130, so that in the running state of the display device 100, the solar cell structure 130 can directly convert ambient light (not shown) into the electric energy required by the electrophoretic display film 140 and temporally store the electric energy for reusing later. In this way, the display device 100 of the embodiment can reduce the demand on the external electric energy and features storing the electric energy and saving energy.

In the description above, only the structure of the display device 100 is introduced without involving the process of the display device 100 of the invention. In following, two embodiments are described to explain the manufacturing method of display devices 100a and 100b, where FIGS. 2A-2F and 3A-3F are associated with the descriptions of the display devices 100a and 100b. It should be noted the component notations and partial details of the structures hereinafter provided in the embodiments can be the same as or similar to the previous embodiment, wherein the same notations represent the same or similar components while the repeated same details are omitted, which can refer to the previous embodiment.

Figure 2A:
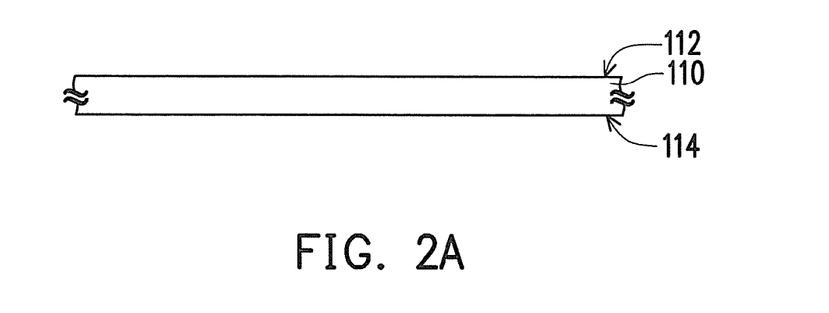
FIGS. 2A-2F are cross-sectional diagrams showing a manufacturing method of display device according to an embodiment of the invention.

FIGS. 2A-2F are cross-sectional diagrams showing a manufacturing method of display device according to an embodiment of the invention. Referring to FIG. 2A, the process of the display device 100a of the embodiment includes following steps. First, a transparent substrate 110 is provided, in which the transparent substrate 110 has an upper surface 112 and a lower surface 114 opposite to each other, and the material of the transparent substrate 110 is, for example, glass or plastic.

Figure 2B:
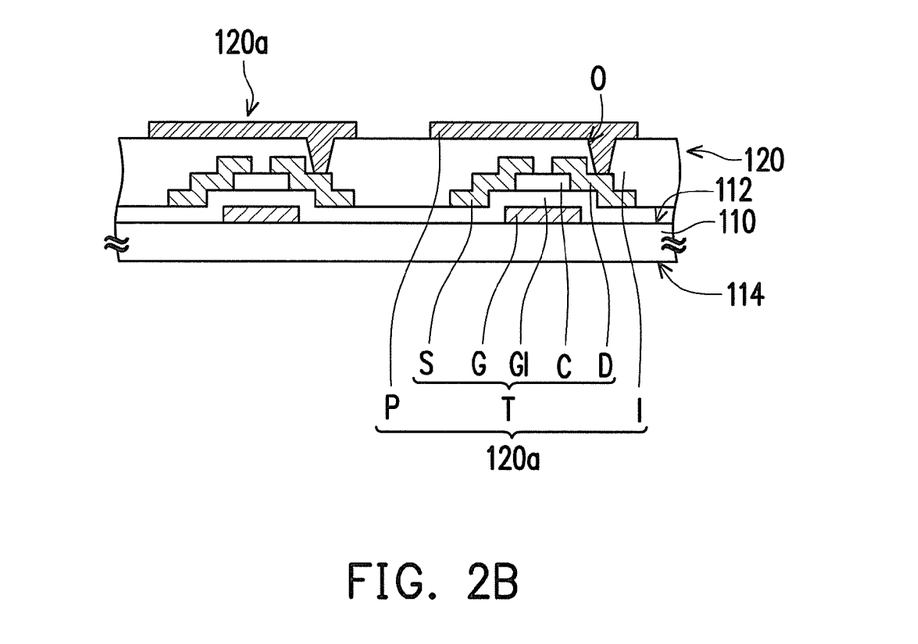

Next, referring to FIG. 2B, an active device array 120 is formed on the upper surface 112 of the transparent substrate 110, in which the active device array 120 has a plurality of pixel structures 120a and each of the pixel structures 120a comprises a gate G, a gate insulating layer GI, a semiconductor channel layer C, a source S, a drain D, an insulating layer I and a pixel electrode P. The insulating layer I herein has an opening O exposing a portion of the drain D and the pixel electrode P is electrically connected to the drain D through the opening O. The gate G, the gate insulating layer GI, the semiconductor channel layer C, the source S and the drain D comprise a thin film transistor (TFT). The TFT T is, for example, a top gate TFT and the material of the pixel electrode P is, for example, transparent conductive material.

Figure 2C:
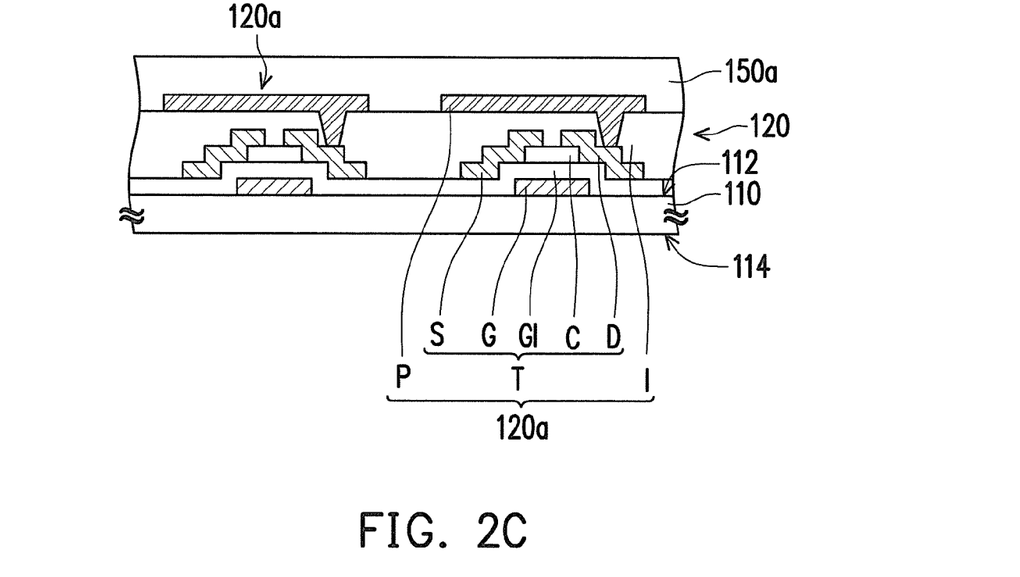

Then, referring to FIG. 2C, a protection layer 150a is formed to cover the active device array 120, in which the material of the protection layer 150a is, for example, silicon oxide, silicon nitride, silicon oxynitride or polymer.

Figure 2D:
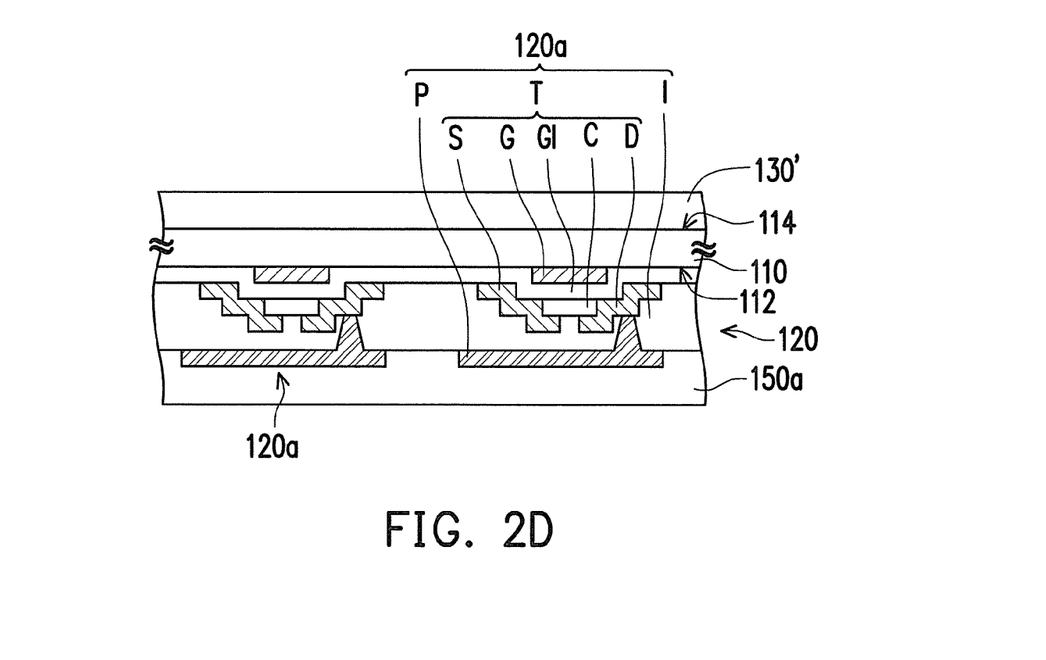

Further referring to FIG. 2D, a solar cell structure 130' is directly formed on the lower surface 114 of the transparent substrate 110, in which the structure of the solar cell structure 130' is similar to the structure of the solar cell structure 130 in FIG. 1B, which is omitted to describe. The solar cell structure 130' herein is, for example, a microcrystalline silicon film solar cell or an organic solar cell. Since the process temperature required by the solar cell structure 130' is lower than the process temperature of the active device array 120, so that the solar cell structure 130' must be fabricated after forming the active device array 120 to ensure the reliability of the solar cell structure 130'.

Figure 2E:
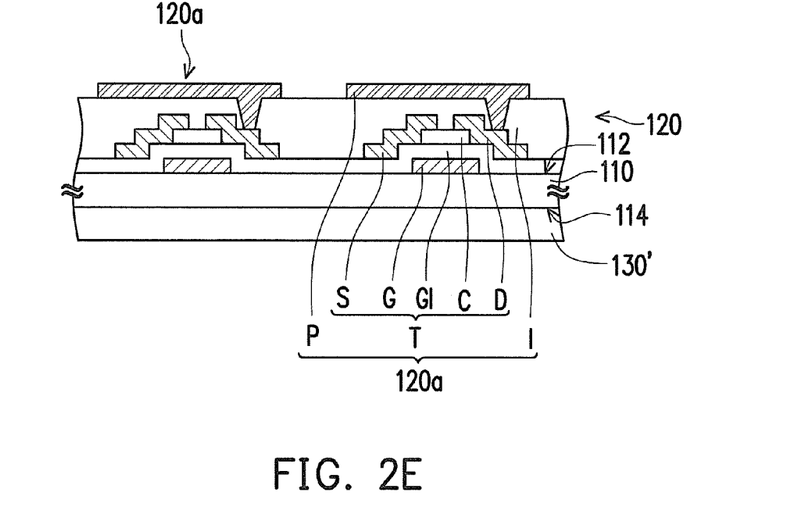

Further referring to FIG. 2E, the protection layer 150a is removed to expose out the active device array 120.

Figure 2F:
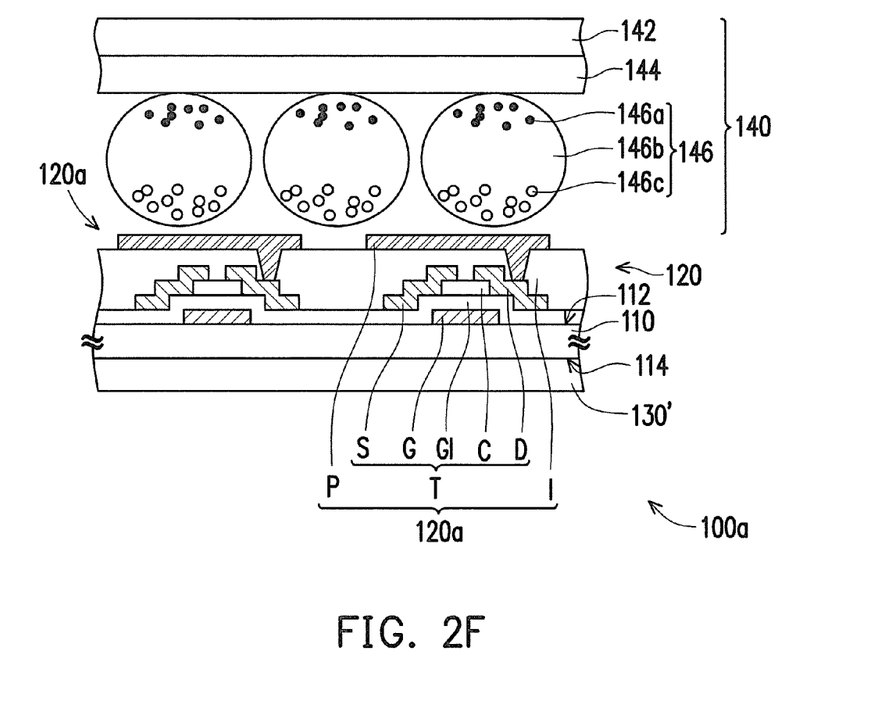

Finally referring to FIG. 2F, an electrophoretic display film 140 is adhered onto the active device array 120. The electrophoretic display film 140 includes a transparent protection film 142, an electrode layer 144 and a plurality of display media 146. The electrode layer 144 is disposed between the transparent protection film 142 and the display media 146 and the display media 146 are located between the electrode layer 144 and the active device array 120. In the embodiment, each of the display media 146 includes an electrophoretic liquid 146b and a plurality of black charged particles 146a and white charged particles 146c both distributed in the electrophoretic liquid 146b, in which the black charged particles 146a and the white charged particles 146c are driven by a DC voltage or an AC voltage. In this way, each of the pixel structures 120a respectively displays black color, white color or gray color with different graylevel, which the invention is not limited to. At the time, the display device 100a is finished.

Since in the embodiment, the active device array 120 and the solar cell structure 130' share a transparent substrate 110, i.e., the active device array 120 and the solar cell structure 130' are respectively located on the upper surface 112 and the lower surface 114 of the transparent substrate 110, so that there is no need to significantly increase the thickness of the display device 100a, the display device 100a has both the function of an electrophoretic display and the energy-storing and energy-saving function of a solar cell.

Figure 3A:
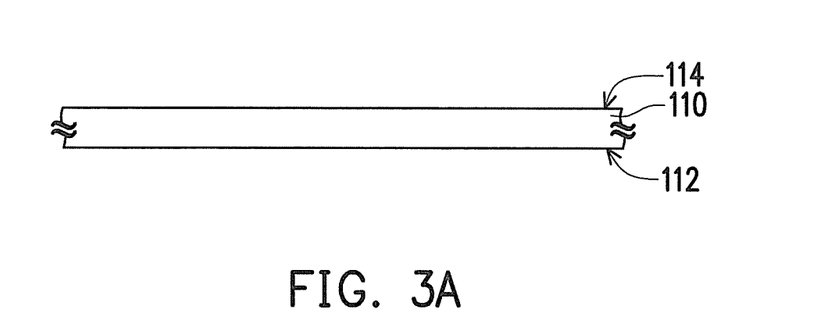
FIGS. 3A-3F are cross-sectional diagrams showing a manufacturing method of display device according to another embodiment of the invention.

FIGS. 3A-3F are cross-sectional diagrams showing a manufacturing method of display device according to another embodiment of the invention. Referring to FIG. 3A, the process of the display device 100b of the embodiment includes following steps. First, a transparent substrate 110 is provided, in which the transparent substrate 110 has an upper surface 112 and a lower surface 114 opposite to each other, and the material of the transparent substrate 110 is, for example, glass or plastic.

Figure 3B:
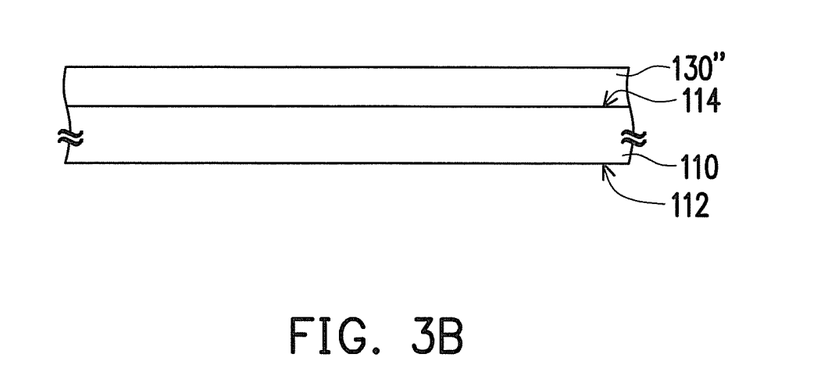

Next, referring to FIG. 3B, a solar cell structure 130" is directly formed on the lower surface 114 of the transparent substrate 110, in which the structure of the solar cell structure 130" is similar to the structure of the solar cell structure 130 in FIG. 1B, which can be understood in referring to the above-mentioned embodiment and is omitted to describe. The solar cell structure 130" is, for example, a microcrystalline silicon film solar cell or a CIGS (copper-indium-gallium-selenide) solar cell.

Figure 3C:
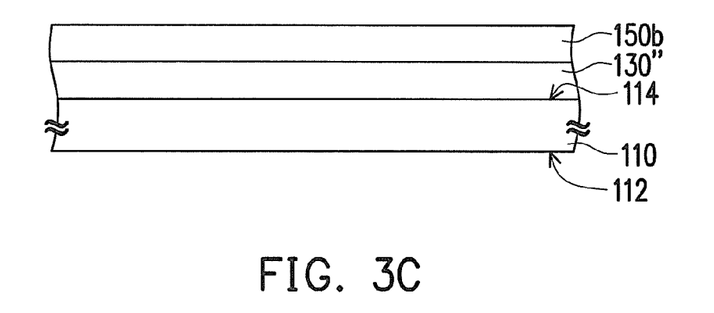

Then, referring to FIG. 3C, a protection layer 150b is formed to cover the solar cell structure 130", in which the material of the protection layer 150b is, for example, silicon oxide, silicon nitride, silicon oxynitride or polymer.

Figure 3D:
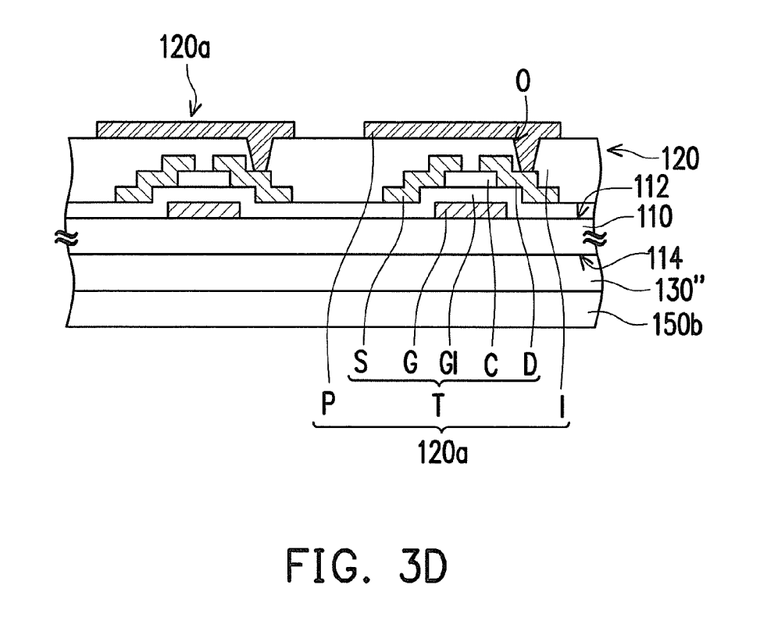

Further referring to FIG. 3D, an active device array 120 is directly formed on the upper surface 112 of the transparent substrate 110, in which the active device array 120 has a plurality of pixel structures 120a and each of the pixel structures 120a comprises a gate G, a gate insulating layer GI, a semiconductor channel layer C, a source S, a drain D, an insulating layer I and a pixel electrode P. The insulating layer I herein has an opening O exposing a portion of the drain D and the pixel electrode P is electrically connected to the drain D through the opening O. The gate G, the gate insulating layer GI, the semiconductor channel layer C, the source S and the drain D comprise a thin film transistor (TFT). The TFT T is, for example, a top gate TFT and the material of the pixel electrode P is, for example, transparent conductive material.

Since the process temperature required by the solar cell structure 130" is higher than the process temperature of the active device array 120, so that the solar cell structure 130" must be fabricated prior to forming the active device array 120 to ensure the reliability of the active device array 120.

Figure 3E:
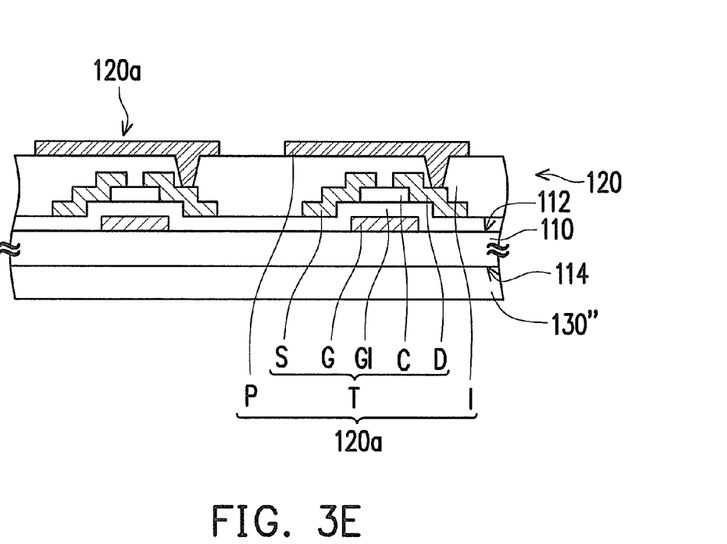

Further referring to FIG. 3E, the protection layer 150b is removed to expose out the solar cell structure 130".

Figure 3F:
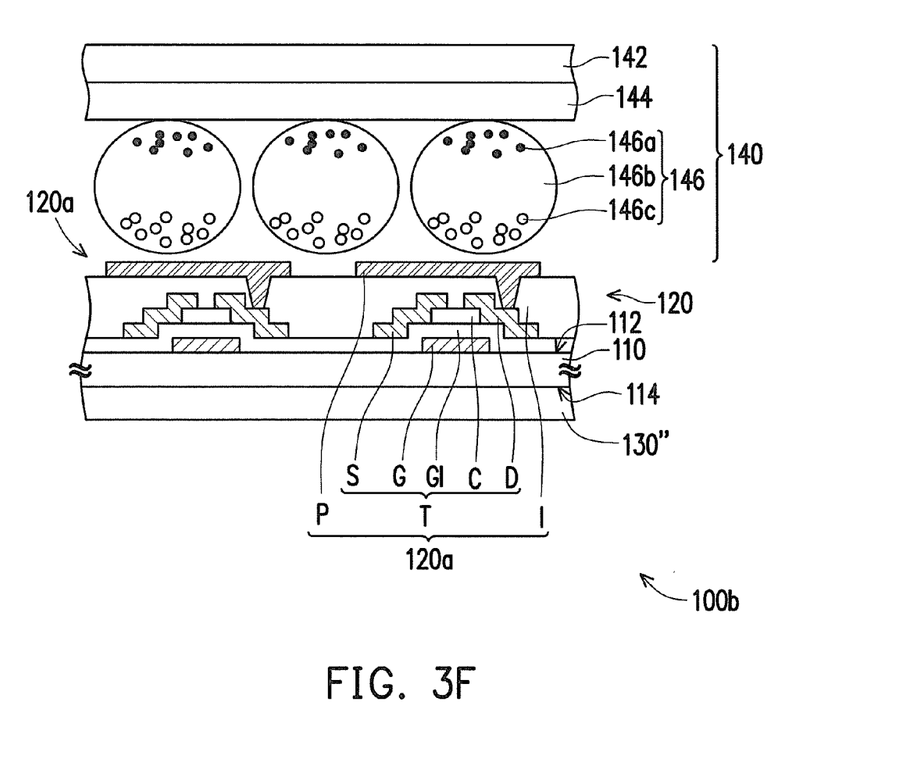

Finally referring to FIG. 3F, an electrophoretic display film 140 is adhered onto the active device array 120. The electrophoretic display film 140 includes a transparent protection film 142, an electrode layer 144 and a plurality of display media 146. The electrode layer 144 is disposed between the transparent protection film 142 and the display media 146 and the display media 146 are located between the electrode layer 144 and the active device array 120. In the embodiment, each of the display media 146 includes an electrophoretic liquid 146b and a plurality of black charged particles 146a and white charged particles 146c both distributed in the electrophoretic liquid 146b, in which the black charged particles 146a and the white charged particles 146c are driven by a DC voltage or an AC voltage. In this way, each of the pixel structures 120a respectively displays black color, white color or gray color with different graylevel, which the invention is not limited to. At the time, the display device 100b is finished.

In summary, since the display device of the invention has a solar cell structure, so that in the running state of the display device, the solar cell structure can directly convert ambient light into the electric energy required by the electrophoretic display film and store the electric energy for reusing later. In this way, the display device of the invention can reduce the demand on the external electric energy and features storing the electric energy and saving energy. In addition, since the active device array and the solar cell structure in the invention share a transparent substrate, so that there is no need to significantly increase the thickness of the display device, the device has both the function of an electrophoretic display and the energy-storing and energy-saving function of a solar cell. Moreover, the corresponding process temperature is estimated prior to fabricate the solar cell structure and the active device array for deciding the fabrication sequence thereof, which is advantageous in ensuring the process reliability of the solar cell structure and the active device array.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A display device, comprising:
   a transparent substrate, having an upper surface and a lower surface opposite to each other;
   an active device array, having a plurality of pixel structures, wherein the pixel structures are disposed on the upper surface of the transparent substrate;
   a solar cell structure, directly disposed on the lower surface of the transparent substrate; and
   an electrophoretic display film, disposed over the transparent substrate and comprising a transparent protection film, an electrode layer and a plurality of display media, wherein the electrode layer is disposed between the transparent protection film and the display media and the display media are located between the electrode layer and the active device array.

2. The display device as claimed in claim 1, wherein the solar cell structure comprises a plurality of cell units, each of the cell units comprises a first conductive layer, a second conductive layer and a photovoltaic layer, the first conductive layer is directly disposed on the lower surface of the transparent substrate and the photovoltaic layer is located between the first conductive layer and the second conductive layer.

3. The display device as claimed in claim 2, wherein the cell units are electrically connected to each other in series.

4. The display device as claimed in claim 2, wherein the first conductive layer comprises a first transparent conductive layer, the photovoltaic layer contains a P-type doped microcrystalline silicon, an intrinsic microcrystalline silicon absorber layer and an N-type doped microcrystalline silicon sequentially disposed on the first conductive layer, and the second conductive layer comprises a second transparent conductive layer and a metallic electrode layer.

5. The display device as claimed in claim 1, wherein the solar cell structure comprises a microcrystalline silicon film solar cell, an organic solar cell, a polysilicon film solar cell or a copper-indium-gallium-selenide solar cell.

6. A manufacturing method of a display device, comprising:
   providing a transparent substrate, wherein the transparent substrate has an upper surface and a lower surface opposite to each other;
   forming an active device array on the upper surface of the transparent substrate;
   directly forming a solar cell structure on the lower surface of the transparent substrate; and
   adhering an electrophoretic display film on the active device array, wherein the electrophoretic display film comprises a transparent protection film, an electrode layer and a plurality of display media, the electrode layer is disposed between the transparent protection film and the display media and the display media are located between the electrode layer and the active device array.

7. The manufacturing method of the display device as claimed in claim 6, wherein the solar cell structure is formed prior to forming the active device array and the solar cell structure comprises a microcrystalline silicon film solar cell or a copper-indium-gallium-selenide solar cell.

8. The manufacturing method of the display device as claimed in claim 7, further comprising:
   after forming the solar cell structure but prior to forming the active device array, forming a protection layer to cover the solar cell structure; and
   after forming the active device array, removing the protection layer to expose out the solar cell structure.

9. The manufacturing method of the display device as claimed in claim 6, wherein the solar cell structure is formed after forming the active device array and the solar cell structure comprises a microcrystalline silicon film solar cell or an organic solar cell.

10. The manufacturing method of the display device as claimed in claim 9, further comprising:
    after forming the active device array but prior to forming the solar cell structure, forming a protection layer to cover the active device array; and
    after forming the solar cell structure, removing the protection layer to expose out the active device array.

* * * * *